United States Patent [19]

Meinel et al.

[11] 4,337,758

[45] Jul. 6, 1982

[54] SOLAR ENERGY COLLECTOR AND CONVERTER

[76] Inventors: Aden B. Meinel; Walter B. Meinel, both of 10121 Catalina Hwy., Tucson, Ariz. 85715

[21] Appl. No.: 35,846

[22] Filed: May 4, 1979

Related U.S. Application Data

[63] Continuation-in-part of Ser. No. 917,735, Jun. 21, 1978, abandoned.

[51] Int. Cl.³ .................... F24J 3/02; H01L 31/00; F28F 7/00
[52] U.S. Cl. ...................... 126/438; 126/450; 136/246; 136/248; 165/185
[58] Field of Search ............... 126/438, 439, 451, 450; 165/185; 136/89 PC

[56] References Cited

U.S. PATENT DOCUMENTS

| | | | |
|---|---|---|---|
| 2,402,662 | 6/1946 | Ohl | 136/89 |
| 3,085,565 | 4/1963 | Macauley | 126/439 |
| 3,263,101 | 7/1966 | Geer | 126/451 |
| 3,766,977 | 10/1973 | Pravda | 165/185 |
| 3,866,285 | 2/1975 | Clark | 126/439 |
| 3,902,794 | 9/1975 | Abrams | 136/89 |
| 3,924,604 | 12/1975 | Anderson | 126/438 |
| 3,959,056 | 5/1976 | Caplan | 126/438 |
| 3,988,166 | 10/1976 | Beam | 136/89 |
| 3,998,206 | 12/1976 | Jahn | 126/438 |
| 4,009,752 | 3/1977 | Wilson | 165/185 |
| 4,048,983 | 9/1977 | Pei | 126/442 |
| 4,050,444 | 9/1977 | Dolamore | 136/89 |
| 4,071,017 | 1/1978 | Russell et al. | 126/438 |
| 4,080,221 | 3/1978 | Manelas | 126/438 |
| 4,084,576 | 4/1978 | Pei | 136/89 |
| 4,089,325 | 5/1978 | Brola | 126/438 |
| 4,146,408 | 3/1979 | Nelson | 136/89 |
| 4,148,295 | 4/1979 | Black | 126/438 |
| 4,173,968 | 11/1979 | Steward | 126/438 |

OTHER PUBLICATIONS

Arifov et al, Solar Thermoelectric Generator, 1967, all pages, Applied Solar Energy.

Primary Examiner—Daniel J. O'Connor
Attorney, Agent, or Firm—Shanley, O'Neil & Baker

[57] ABSTRACT

A single reflective afocal optical module collects and concentrates solar energy onto a receiving surface extending substantially parallel to the focal axis of the optical system and to the central axis of the module. The reflective surface of the collector is shaped to reflect incoming energy and distribute it uniformly over the full surface of the receiver, with the reflective surface preferably consisting of a plurality of discrete reflective surface portions each distributing its portion of reflected energy over the full receiver surface so that the energy portions from the respective reflective surface portions are superimposed on one another on the receiver. The reflector and receiver are housed in a sealed enclosure having a transparent window for admitting incoming energy, and heat extracting means removes excess heat from the enclosure.

28 Claims, 5 Drawing Figures

SOLAR ENERGY COLLECTOR AND CONVERTER

CROSS REFERENCE TO RELATED APPLICATIONS

This is a continuation-in-part of our copending application Ser. No. 917,735 filed June 21, 1978, now abandoned.

BACKGROUND OF THE INVENTION

1. Field of the Invention

This invention relates to modules useful in the collection and conversion of electromagnetic radiation and more particularly to an improved single reflection nonfocusing optical module useful in apparatus for the collection of solar energy and the conversion of such energy into electrical and/or heat energy.

2. Description of the Prior Art

The recent emphasis placed upon fossil fuel conservation has resulted in a proliferation of apparatus for the collection and conversion of solar energy. The prior art devices generally have employed a solar collector having a reflective surface, usually in a generally parabolic configuration, for focusing the reflected energy onto a receiving surface either directly or through a folding optical system. Non-imaging optical collectors are also known, examples being found in U.S. Pat. No. 3,899,672 and in our own prior U.S. Pat. No. 4,131,485. Known folded reflective optical systems generally have employed a receiving surface disposed substantially perpendicularly to the optical axis of the collectors, particularly when the receivers are in the form of solar cells for converting the solar energy directly into electrical energy.

In the use of photovoltaic solar cells as the receiver for a solar collector, the solar energy collected from the large surface area of the collector should be concentrated and distributed as uniformly as possible over a discrete area defined by the solar cells, as opposed to the point or line focusing frequently desired for thermal conversion. While the uniform distribution of reflected solar energy over a discrete area can be obtained by carefully defocusing a Fresnel lens or parabolic mirror on a receiver normal to the optical axis, the present invention extends the art to include a receiver parallel to the optical axis, with attendant advantages such as averaging out manufacturing errors.

Our above-identified U.S. Patent is directed to one system employing two reflective surfaces, with a nominal ray crossover point in front of the receiving element, for distributing available energy across the receiving element in a manner to avoid hot-spot problems in a solar cell apparatus. That system also employs a third reflective surface for collecting and re-directing stray energy onto the receiving element to compensate for errors in the reflective surface or the tracking system. While that collecting and concentrating system can be employed with both thermal receivers and solar cells, the apparatus is relatively expensive to manufacture due both to the use of the folded reflective optical system and to the manufacturing tolerances necessary for efficient operation of the apparatus. Accordingly, it is a primary object of the present invention to provide an improved collector of electromagnetic radiation particularly useful in the conversion of solar energy to useful electric energy.

Another object of the present invention is to provide such an improved apparatus which has enhanced performance and durability and in which the optical receiver and protective window are sealed with the receiver inside the enclosure.

Another object of the invention is to provide such an apparatus employing photovoltaic receivers having their receiving surfaces extending substantially parallel to the central axis of the module.

Another object is to provide a compact single reflective, afocal optical system capable of substantially uniformly distributing the concentrated solar energy over a receiver surface.

SUMMARY OF THE INVENTION

In the attainment of the foregoing and other objects and advantages of the invention, an important feature resides in providing a compact single reflective, afocal optical system for collecting and concentrating solar energy onto a receiver having its receiving surface disposed substantially parallel to the central axis of the module. The receiver and the reflective surface of the collector are preferably located within a closed and sealed envelope for protection against the elements and against the adverse effects of accumulated dirt and other contamination. The reflective surface can consist of a continuous surface but preferably consists of a plurality of discrete reflective surface portions each having a configuration and orientation to substantially uniformly distribute reflected solar energy over the entire receiver surface, with the energy reflected from the separate discrete reflective surface portions being superimposed upon, or overlapping one another on the receiver surface. Means are also provided for removing excess heat when the receiver employed is a solar cell whereby the temperature of the solar cell is maintained under control for maintaining the efficiency of the solar cells. Both active and passive cooling is contemplated for the solar cell embodiments, with active cooling being employed in the thermal conversion embodiments.

BRIEF DESCRIPTION OF THE DRAWINGS

The foregoing and other objects and advantages of the invention will become more apparent from the detailed description contained hereinbelow, taken in conjunction with the drawings, in which.

DESCRIPTION OF THE PREFERRED EMBODIMENTS

Figure 1:
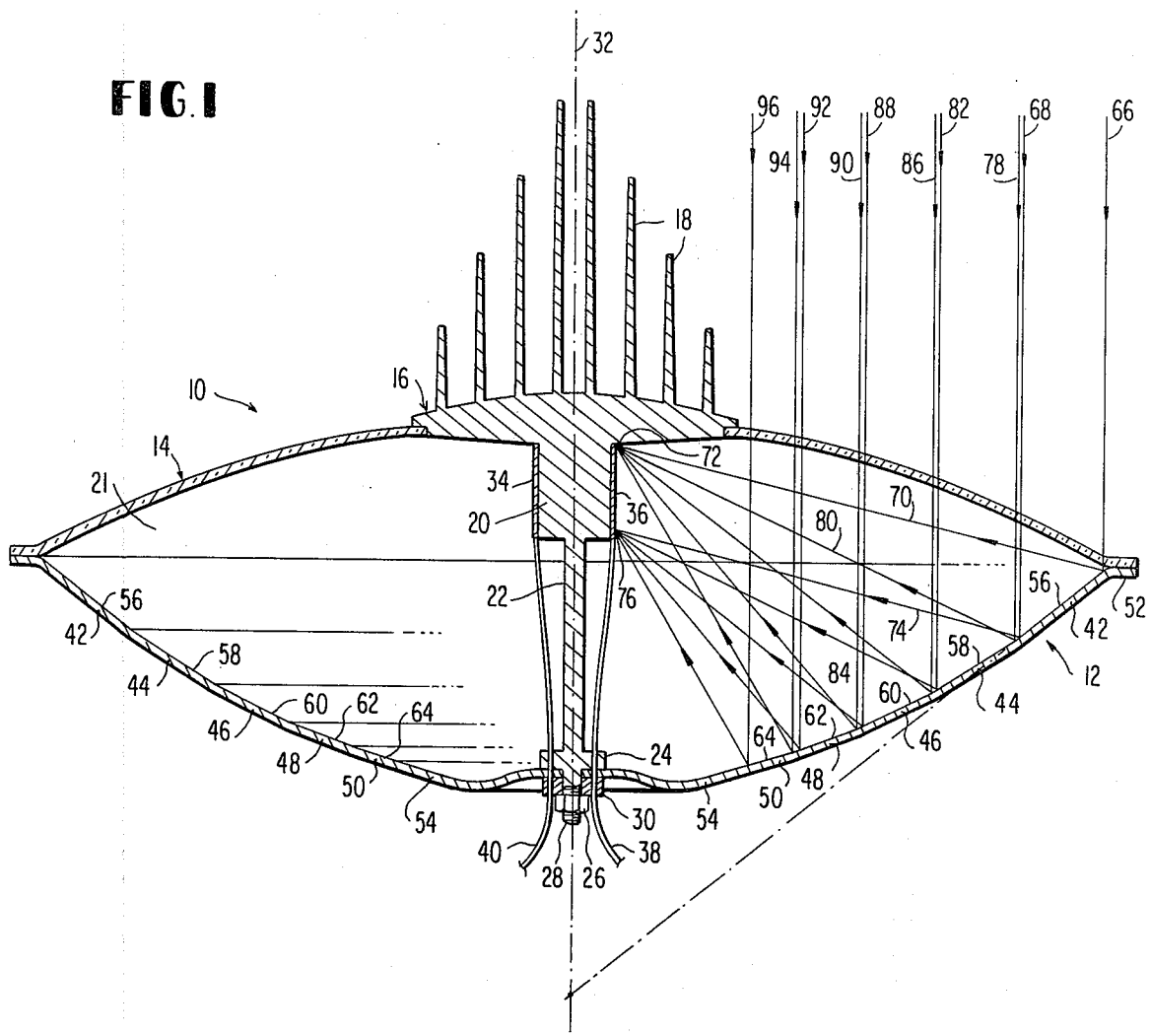
FIG. 1 is a cross-sectional view of one embodiment of the invention which may be developed by rotating the cross-section of this FIG. about its axis of symmetry or by translating the cross section of this FIGURE along a line perpendicular to the plane of said axis of symmetry.

Referring now to the drawings in detail, the energy collection and conversion module illustrated in FIG. 1 is designated generally by the reference numeral 10 and comprises an upwardly facing concave reflector element 12 having a transparent window or lens 14 mounted thereon. A heat sink 16 having a plurality of upwardly extending fins 18 integrally formed thereon is sealed in and projects through a central opening in the window 14. Heat sink 16 has a body portion 20 located within the hermetically sealed envelope 21 of the module, with an extension or support means 22 extending downwardly through the central portion of reflector 12. A shoulder or flange 24 on extension 22 engages the inner surface of reflector 12, and a nut 26 mounted on the threaded end 28 of the extension firmly clamps the reflector and retains the entire assembly in rigidly joined relation. A sealing washer 30, preferably formed of a slightly resilient synthetic resin material, may be provided between the nut 26 and the outer surface of reflector 12.

The embodiment of the invention illustrated in FIG. 1, as well as the other embodiments described hereinbelow, may be developed as a generally circular module by rotating the illustrated cross-section about the central axis or axis of symmetry illustrated by the line 32 which then corresponds to the optical or focal axis of the developed circular module. Alternatively, an elongated trough-shaped module may be developed by translating the cross-section of FIG. 1 along a line perpendicular to the axis 32 and to the plane of the cross-section. It will be apparent to those skilled in the art that the operation and function of the various components will be similar whether the module is evolved as a circular structure or an elongated trough-shaped structure and therefore the description herein will be directed primarily to the circular configuration.

The heat sink body portion 20 is substantially prism-shaped, having a plurality of side faces extending in parallel outwardly spaced relation to the optical axis 32, and photovoltaic solar cell receivers 34, 36 are mounted on the flat face surfaces of the heat sink body, in heat exchange relation therewith. While only two receivers 34, 36 are illustrated in the drawing, it is understood that, for a circular module, additional receivers would be employed. For example, the heat sink body 20 can be in the configuration of a hexagonal or octagonal prism with each side face of the prism having one or more receivers mounted thereon to define a substantially continuous receiving surface band around the periphery of the body portion 20 of the heat sink 16.

The respective solar cell receivers can be electrically connected to a using system, not shown, by means of conductors 38, 40 extending from the module through openings in the shoulder 24 and corresponding, aligned openings in the reflector 12 and sealing washer 30. Suitable sealing means are provided to form a hermetic seal at the overlying peripheral edge portions of the reflector 12 and window 14, and between the window 14 and the heat sink 16 whereby the complete module, when assembled, is permanently sealed. If desired, an inert atmosphere may be employed in the sealed interior of the module, and the interior may be partially evacuated on assembly to avoid excessive internal pressures due to heat buildup during use.

The reflector 12 employed in the module of FIG. 1 consists of a plurality of concentric ring segments each being in the configuration of a right circular segment of a cone, with adjacent segments being integrally joined at their adjacent edges. Thus, as shown in FIG. 1, reflector 12 consists of five concentric conical ring segments 42, 44, 46, 48 and 50, with a substantially radially extending sealing flange 52 being integrally formed with and projecting outwardly from the maximum-diameter edge portion of ring segment 42 and a central segment 54 extending inwardly from the minimum-diameter edge of ring segment 50 to be joined to the flange 24, as described above. The conical ring segments each has one reflective surface, illustrated as the inner surfaces 56, 58, 60, 62 and 64, respectively, of the ring segments 42, 44, 46, 48 and 50, respectively. The reflective surfaces are shaped and located with respect to the receivers to reflect light substantially uniformly over the receiver surfaces when the module is oriented with the optical axis pointed to the energy source, e.g., the sun.

The optical behavior of the respective conical ring segments may be understood from a consideration of incoming parallel energy rays striking the reflective surface along a common line element of one conical ring and being reflected therefrom onto the receiving surface. Thus, spaced parallel light rays 66, 68 emanating from the sun pass through the transparent window 14 and strike the reflective surface 56 adjacent to its outer and inner peripheral edge portions, respectively. Ray 66 is reflected as ray 70 to a point 72 at the top edge of receiver 36, i.e., the edge farthest from the reflector 12. Similarly, incoming ray 68 is reflected as ray 74 to a point 76 at the bottom edge of receiver 36. All incoming rays within the plane of and located between rays 66 and 68 will be reflected along lines parallel to reflected rays 70 and 74 and be distributed uniformly along the length of the receiver 36 between points 72 and 76. Since reflective surface 56 is a conical segment, the entire circular array of light rays striking the surface will be reflected and distributed on the receiving surfaces around the periphery of heat sink body 20.

Ring segments 44, 46, 48 and 50 are also conical segments having straight line elements but, being of progressively smaller diameter, the angle of the line elements, of the conical segments relative to the focal axis is changed so that rays striking the reflective surfaces of the respective ring segments are reflected so as to be distributed over the surface of the receivers in the same manner described above. Thus, incoming ray 78 strikes the radially outer edge of reflective surface 58 and is redirected as reflected ray 80 to point 72 and incoming ray 82 strikes the radially inner edge portion of reflective surface 58 to be redirected as ray 84 to point 76. As with reflective surface 56, all rays between rays 78 and 82 and striking reflective surface 58 along the common line element of the conical surface will be redirected to the receiver 36 and distributed uniformly thereover. Incoming solar rays 86, 88 striking reflective surface 60, rays 90, 92 striking reflective surface 62, and rays 94, 96 striking reflective surface 64 are similarly redirected, as are the light rays between these pairs of rays, to be distributed over the receiver surfaces so that the annular rings of redirected solar rays are each distributed over the receiver surface with the respective rings of redirected rays being overlapped or superimposed on one another on the receivers. This overlapping of a plurality of concentric rings of redirected solar rays onto the receiver surfaces results in an inherent averaging of errors which may result from minor deviations from the desired surface contour or the like, thus assuring a better uniformity of distribution of the incoming rays along the full length of the receiver surface. Such averaging tends to minimize the adverse effect on the efficiency and on the life expectancy resulting from hot or cold spots on photovoltaic solar cells which may be used to make up the receiver surfaces.

Figure 2:
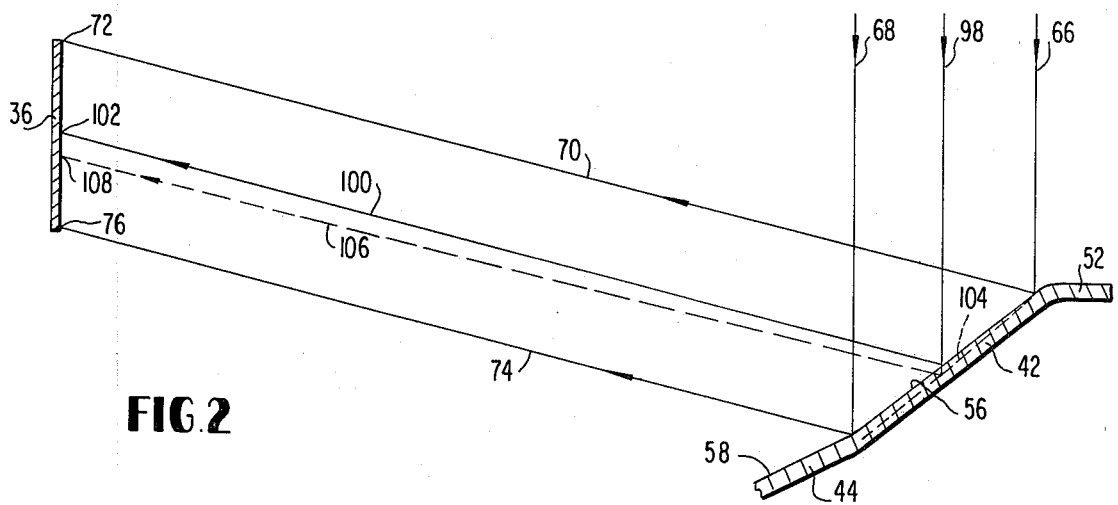
FIG. 2 is a fragmentary sectional view, on an enlarged scale, of a portion of the structure shown in FIG. 1.

Referring now to the fragmentary sectional view of FIG. 2, incoming rays 66, 68 are shown as being redirected from reflective surface 56 as rays 70, 74, respectively, arriving at the points 72, 76, respectively, on receiver 36 as described above. In addition, an incoming ray 98, parallel to and spaced midway between rays 66, 68, is shown being redirected from surface 56 as ray 100 which strikes receiver 36 at point 102 located midway between points 72 and 76. Thus, since the surface elements of the conical ring portion 42 is a straight line, the distance between points 76, 102 and 72 on receiver 36 will be directly proportional to the distances between incoming rays which strike the reflective surface along a common element of the conical reflective surface 56. However, because the area of conical ring segment 42, and consequently of reflective surface 56, increases with increased radial distances from the axis 32, the intensity of the reflected or concentrated radiation striking receiver 36 in the area of point 72 will be correspondingly greater than at point 76.

If more precise uniformity of distribution of concentration along the axial length of the receivers is required, or if it is otherwise desired to vary the distribution of the reflected energy onto the receiver surfaces, the conical rings can be modified by slightly curving the line elements of the cone as schematically shown by the broken line 104. Note that the slope of broken line 104 is the same as that of surface 56 at its upper and lower extremities, but that the slope varies between these extremities to produce the desired distribution of reflected energy on the receiver surface. In this configuration, the ray 98 will strike the curved reflective surface illustrated by line 104 and be redirected as reflected ray 106 to strike the receiver 36 at point 108 rather than at point 102, thus changing the distribution of the redirected rays over the surface of the receiver. The exact curvature of the line elements of the modified cone sections can easily by calculated to produce an even distribution along the length of receiver 36. It is apparent, also, that the remaining ring segments 44, 46, 48 and 50 can similarly be curved to achieve the desired light concentration. This compensating curvature would not, of course, be required for the elongated, trough-shaped modules.

Figure 3:
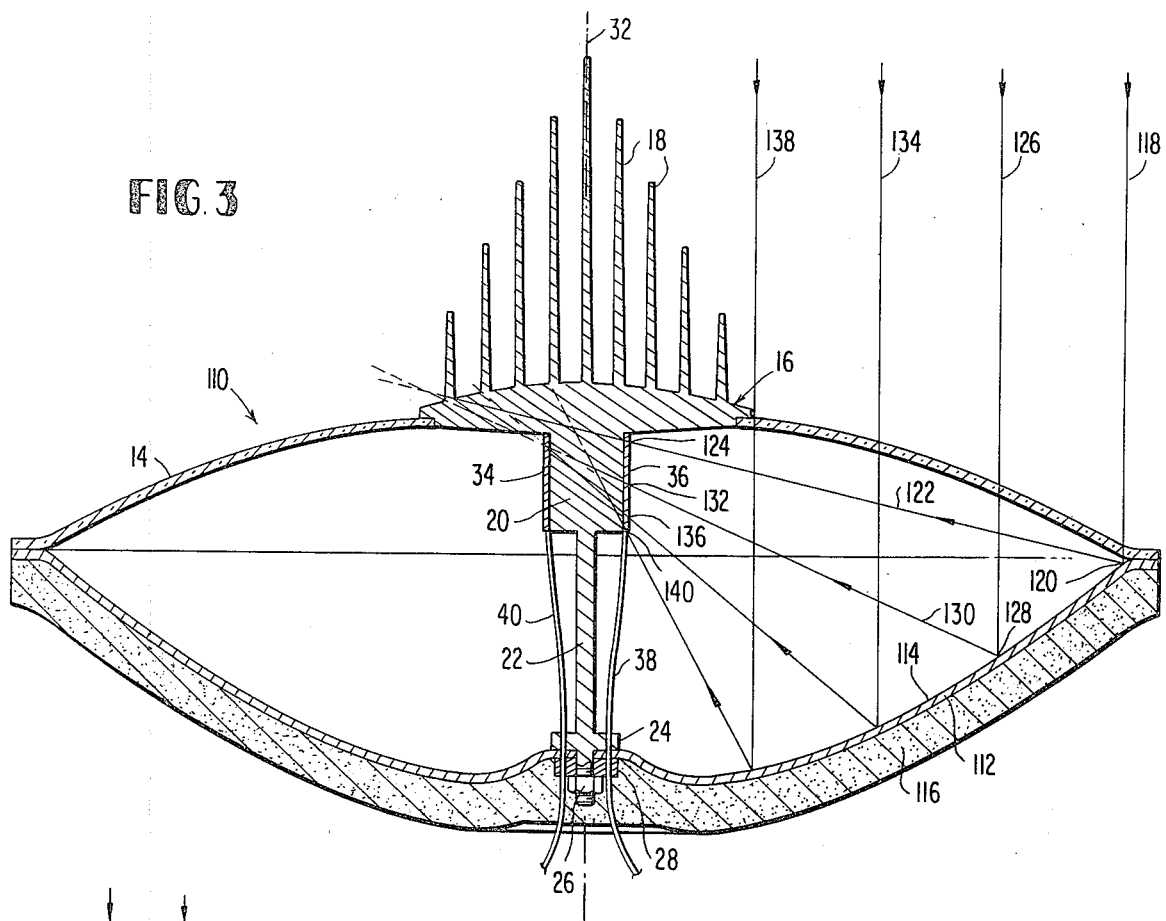
FIG. 3 is a view similar to FIG. 1 and illustrating an alternate embodiment of the invention.

In the embodiment of the invention shown in FIG. 3, the module embodies a somewhat different reflector configuration but the other components employed are identical to those described above with reference to FIG. 1. Accordingly, the same reference numerals have been employed to identify identical components of the embodiments of FIGS. 1 and 3, and the description of such components will not be repeated.

The module of FIG. 3 is designated generally by the reference numeral 110 and employs a reflector structure 112 which has a relatively shallow, dish-shaped configuration having a single smooth reflective surface 114 which may be described as a single conical ring in which the line elements of the reflective surface are slightly curved in the planes containing the focal axis to present a doubly curved, upwardly and inwardly concave reflective surface. A protective covering 116 provides protection from damage in handling and exposure to the elements in use. Covering 116 may be of any suitable material compatible with the material of the reflector 112 and may be cast directly upon the external surface of the reflector or separately formed and bonded thereto. A similar backing may be provided for the reflectors of any of the embodiments, where desired or necessary.

The slightly curved configuration of reflective surface 114 is calculated to provide a uniform distribution of reflected energy onto the receiver surface, taking into account the increased surface area of the radially outer portion of the reflector and the resulting increased quantity of reflected energy directed onto the receiver surface from this radially outer portion. As described above with regard to the modification shown in FIG. 2, the curvature of the reflective surface 114 is controlled to account for this uneven distribution of incoming rays in the circular embodiment of the module to produce the desired distribution of the receiver. The shape of the reflective surface may therefore be described as afocal or non-focusing since no focus, in the conventional meaning of the term, results.

The optics of the afocal reflective surface 114 employed in module 110 can be understood from a consideration of a number of equally spaced incoming rays striking the reflective surface along a common line element of the surface. Thus, ray 118 is illustrated as striking the reflective surface 114 at a point 120 adjacent its radially outermost extent, with the ray 118 being redirected as reflected ray 122 to impinge upon the receiver 36 at a point 124 adjacent the top of the receiver, the top again being considered as the portion spaced farthest from the reflector along the axis 32. Incoming ray 126 strikes reflective surface 114 at a point 128 and is redirected as reflected ray 130 to impinge upon receiver 36 at point 132 while ray 134 is ultimately directed onto receiver 36 at point 136 and ray 138 arrives on the receiver at a point 140. While incoming rays 118, 126, 134 and 138 are equally spaced from one another, 124, 132, 136 and 140 are progressively closer together from the top to the bottom of the receiver. The spacing between these discrete points on the receiver surface has thus been varied so as to be a desired function of the radial distance from the optical axis of the respective incoming rays, so as to compensate for the different areas between rays 118, 126, 134 and 138 and variation of reflective loss at receivers 36 due to variation of the angle of arrival of the rays on the receiver. It will be apparent that all rays intermediate to the incoming rays described will also be proportionally distributed so as to provide a uniform or other desired concentration on the receiver surface. This desired distribution of the rays along the receiver surface is achieved by appropriately shaping the curvature of the generally conical reflector surface portion 114 of receiver 112, which curvature can readily be calculated by using known mathematical formula. Thus the configuration of FIG. 3 may be described as a modification of the embodiment of FIG. 1 in which a single conical ring, with the desired slight curvature, is employed to achieve the desired reflected energy distribution on the receiver's surface. It will be understood, however, that the averaging benefits obtained by employing a plurality of such conical ring surfaces are not obtained by the single ring of FIG. 3.

Figure 4:
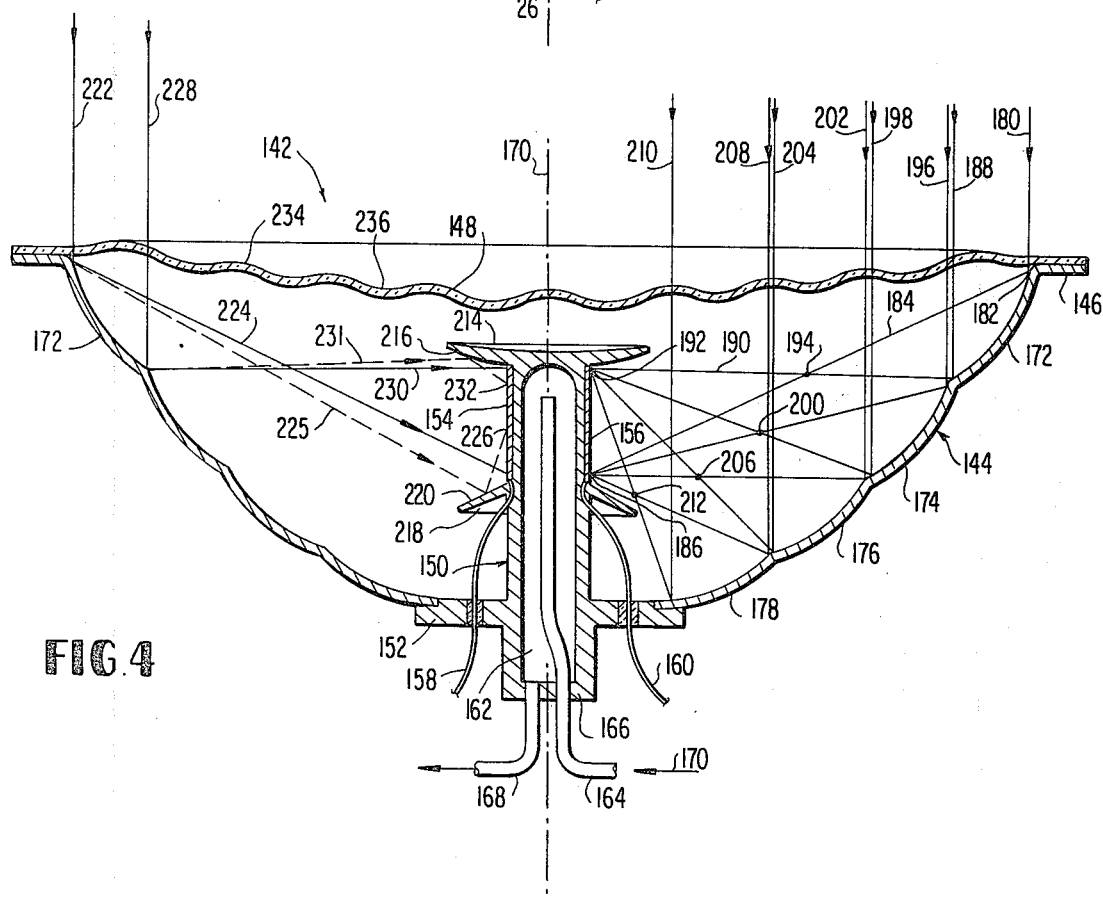
FIG. 4 is a view similar to FIGS. 1 and 3 and illustrating a further embodiment of the invention.
Figure 5:
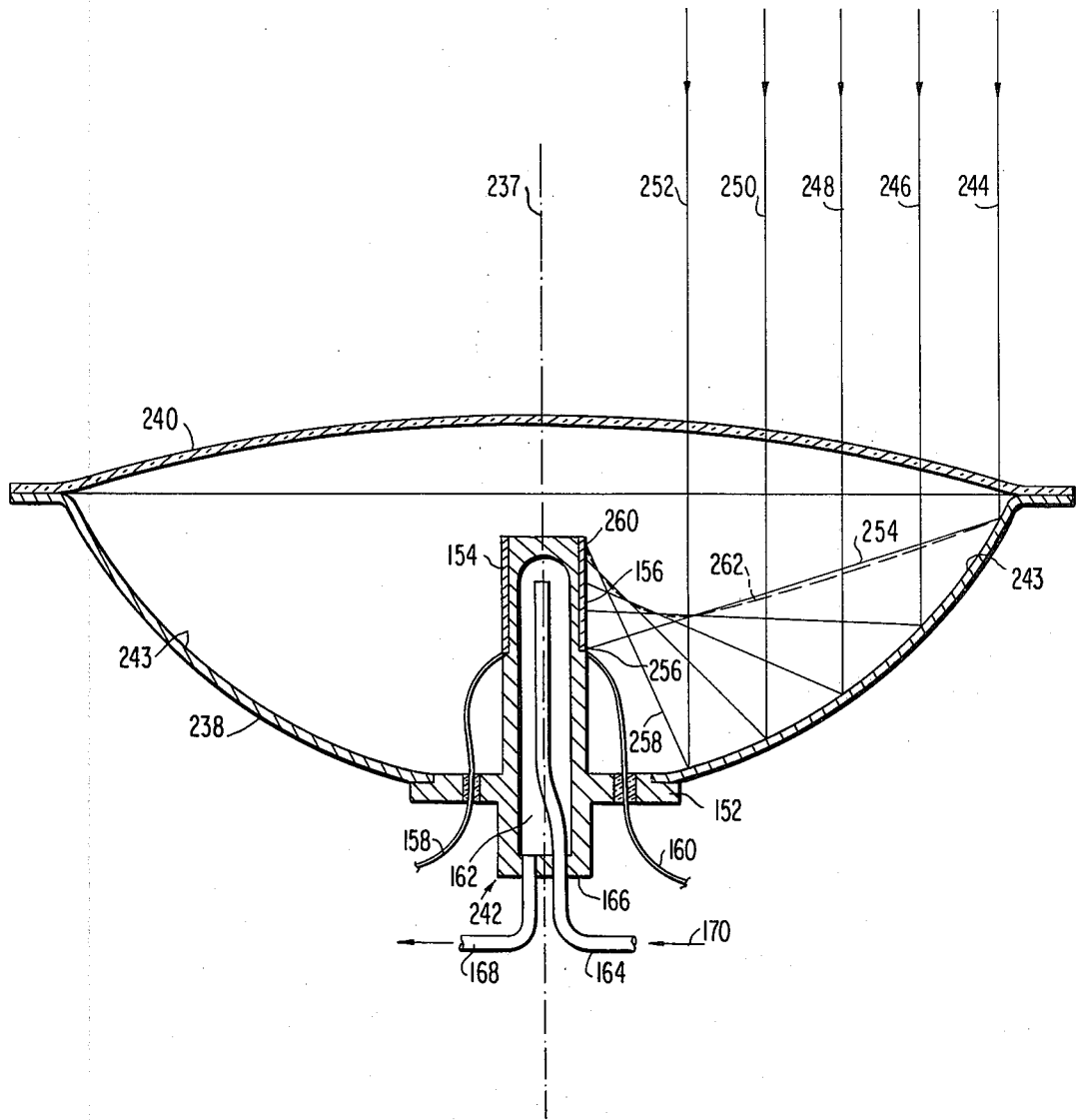
FIG. 5 is a view similar to FIGS. 1, 3 and 4 and illustrating a still further embodiment of the invention.

The embodiments of FIGS. 4 and 5 each depict the use of an active cooling system wherein a circulated cooling fluid is employed to extract heat from the receivers. It should be apparent that such circulating fluid cooling systems could be employed to provide positive cooling for the receivers in the embodiments of FIGS. 1-3.

The module of FIG. 4 is indicated generally by the reference numeral 142 and includes a generally dish-shaped reflector 144 having a radially extending flange 146 around its top periphery onto which is hermetically sealed a transparent window 148. An elongated receiver assembly or support means 150 having a radially extending flange 152 integrally formed thereon is rigidly mounted in a central opening in the bottom portion of reflector 144, with the reflector being sealed to the flange 152. Receiver assembly 150 extends into the interior of the module and has firmly mounted thereon in heat contact relation with its outer surface a plurality of receiver elements 154, 156, as previously described, defining receiving surfaces. Receiving elements 154, 156 are connected to conductors 158, 160, respectively, extending out through hermetically sealed apertures in the flange 152 for connecting the receivers to a point of electrical consumption.

The receiver assembly has a hollow interior cavity 162, and a fluid conduit 164 extends through the bottom wall 166 into the cavity and terminates in an open end adjacent the top of the cavity. An outlet pipe 168 is also connected in an opening in the bottom wall 166, with pipe 168 having an open inlet end spaced below the top wall. Thus, cooling fluid flowing in the direction of arrow 170 will be discharged against the closed top wall of the cavity 162 then flow downwardly along the inner walls of the cavity to exit through pipe 168. This cooling fluid will absorb and carry heat away from the relatively thin heat conducting wall portion of the receiver assembly beneath the receiver elements 154, 156.

The energy collecting and conversion elements of the module shown in FIG. 4 are symmetrical about the central axis 170 which is the axis of rotational symmetry for the circular configuration of the module. Again, it is understood that axis 170 may be considered to represent the center plane of a module of elongated trough-shaped configuration, with the apparatus functioning in substantially the same manner as described with respect to the circular configuration. In the circular embodiment of the module, the reflector element comprises a plurality of integrally formed, concentric ring portions 172, 174, 176 and 178 each having the general configuration of a segment of a cone but with the line elements of the ring segments being a curve instead of a straight line as in the case of a classic cone. Further, the curved line elements are concave on the inner surface of the reflector with the curvature being such as to reflect the incoming rays in the desired distribution onto the surface of the receivers as described below. Again, the outer peripheral surface portion of the receiver assembly having the receiver elements 154, 156 mounted thereon is in the configuration of a plurality of flat surfaces each extending generally parallel to the axis 170.

As with the previously described embodiments, operation of this module may be understood from consideration of selected incoming, parallel rays striking the reflective surfaces of the various reflector segments along a line element thereof. Thus, incoming ray 180 strikes the reflective surface of the outermost ring element 172 at point 182 and is redirected as ray 184 to strike the lowermost edge portion of receiver 156 at point 186. At the same time, incoming ray 188 strikes the reflective surface of ring portion 172 adjacent its radially innermost extremity and is redirected as ray 190 to strike the upper edge portion of receiver 156 at point 192, with redirected rays 184 and 192 crossing at a point 194 within the interior of the module.

Rays intermediate to rays 180 and 188 and contained in the same plane will be similarly redirected to be distributed over the vertical extent of the receiver 156, with such redirected rays crossing one another substantially at the crossover point 194. Similarly, incoming rays 196 and 198 strike the reflective surface of ring segment 144 and are redirected through crossover point 200 to points 186, 192, respectively, on the receiver 156. Incoming rays striking the reflective surface of ring element 176, represented by rays 202, 204 pass through crossover point 206 while the rays striking the reflective surface of the innermost ring element 178, along the curved line element thereof, are represented by incoming rays 208, 210 and pass through crossover point 212 to be distributed along the vertical length of receiver 156. Thus, reflected radiation from the respective reflective ring surfaces forms a ring focus between the reflector and receiver so that the reflected radiation is inverted on the receiver. This arrangement makes it possible to locate the receiver closer to the reflector, along the focal axis, and provides a very compact, sturdy module.

By slightly modifying the curvature of the reflective ring segments of the embodiment illustrated in FIG. 4, the reflected energy can be uniformly distributed on the receiver despite the increased reflective surface at increased radial distances from the focal axis. This slight modification will result in some of the reflected rays crossing at points slightly spaced from a true focus point, e.g., points 194, 200, 206 or 212, but not by an amount to materially affect the principle of the ring focus and the inverted radiation pattern on the receiver.

Receiver assembly 150 can further be provided with a flange 214 having a generally conical, reflective bottom surface extending outwardly and upwardly from a position adjacent the top of receivers 154, 156 and a second flange 218 having a generally conical upper surface 220 extending outwardly and downwardly from a position adjacent the bottom of the receivers. The reflective surfaces 216, 220 are arranged to receive and redirect any misdirected rays onto the receiver surfaces. Thus, referring to the left hand side of FIG. 4, incoming ray 222 would normally strike the reflective surface of ring portion 172 and be redirected as ray 224 to impinge upon receiver 154 at a point adjacent the bottom edge thereof. However, if the reflector does not conform exactly to the intended configuration due for example to manufacturing tolerances, abuse in handling, or other reason, the ray may be redirected along broken line 225 to be reflected off the surface 220 and back onto the receiver as at point 226. Similarly, incoming ray 228 would normally be redirected onto the top portion of the receiver surface as reflected ray 230 but may be misdirected along the broken line 231 to be reflected off the reflective surface 216 onto the receiver as at point 232.

The window element 148 is shown in FIG. 4 as including a plurality of concentric ridges 234 and valleys 236 arranged to constitute annular corrugations concentric with the axis 170, or parallel to the central plane 170 in the case of the trough-shaped embodiment. The optical effect of such an undulated surface on incoming rays is negligible since the window is formed from a transparent sheet of uniform thickness so that its top and bottom surfaces are parallel. These corrugations serve, however, to strengthen the window against damage by impact or concentrated load and to permit limited deflection to accommodate internal pressure changes within the module which may result from substantial temperature changes. This corrugated window concept can also be employed to advantage with other embodiments of the invention.

Referring now to FIG. 5, a further modification of the invention is illustrated in which the cross-sectional view is again illustrated as symmetrical about the central or optical axis 237 which, again, may be considered the longitudinal center plane or focal plane when the module takes an elongated, trough-shaped configuration. The module includes a sealed envelope defined by a generally bowl-shaped reflector element 238, a transparent window 240 and a receiver assembly or support means 242. The receiver 242 is illustrated as being identical to receiver assembly 150 employed in the embodiment of FIG. 4, except that the assembly 242 does not employ the outwardly extending flanges adjacent the end portions of the receiver elements to capture misdirected rays. In view of the similarity in the two assemblies, assembly 242 will not be further described here and the same reference numerals will be employed to identify like portions of the two receiver assemblies.

The reflector 238 has a single aspheric, curved reflective surface for directing incoming solar rays onto the receiver surface. The reflective surface 243 has the necessary curved configuration to cause parallel incoming rays to be redirected onto the receiver along its full length in such a manner as to produce a substantially uniform brightness over the full area of the receiver elements.

The optical behavior of the curved reflective surface 243 can be illustrated by a consideration of a number of parallel, equally spaced incoming rays 244, 246, 248, 250 and 252 which strike the reflective surface along a common curved element. Thus, ray 244 strikes the reflective surface 243 adjacent its outer peripheral edge and is redirected as ray 254 to strike the receiver element 156 at point 256 adjacent its bottom edge while ray 252 strikes the reflective surface adjacent its inner peripheral edge and is redirected as ray 258 to strike the receiver element 156 at a point 250 adjacent its top edge. All incoming rays between rays 244 and 252, represented by rays 246, 248 and 250, will be redirected from the reflective surface 243 to impinge upon the receiver 156 at points spaced along the length of its surface, with adjacent rays along this common element crossing between the reflecting surface and the receiver. It is noted, however, that all such rays do not cross at a common point, or focus, but rather that the crossing point of the adjacent rays fall along a curved path indicated generally by the broken line 262, providing a soft focus that is generally termed a caustic.

The curvature of the reflective surface 243 can easily be calculated, using known mathematical formulas commonly employed in optical calculations, to produce a uniform brightness or other desired distribution along the full length of the receiver surface. This means that to achieve a uniform brightness distribution, equally spaced parallel incoming rays strike the receiver surfaces at points which are not equally spaced but rather which are spaced at progressively shorter distances from the bottom to the top of the receiver surface. This space differential will vary in accordance with the difference in the total reflecting area between the adjacent rays around the circumference of the circle and reflectance characteristics of receiver element 156. This condition of uniform brightness is particularly important in order to optimize efficiency where photovoltaic cells are employed as the receiver. It is apparent, however, that the curvature would be different for non-circular modules such as the straight line, generally trough-shaped reflecting surface wherein there would be no difference in collection area at progressively greater distances from the central focal plane.

Each of the embodiments are illustrated in the drawings and are described as employing photovoltaic solar cell receivers which require relatively close temperature control for maximum efficiency in converting solar energy to usable electricity. Two basic means are illustrated for removing waste heat and thereby controlling operating temperature of the solar cells. Various other waste heat removal means, both passive and active, may be employed in the implementation of this invention. For example, a commercially available heat pipe can be mounted within the receiver body, with the evaporator section of the heat pipe positioned adjacent the receiver portion of the assembly and the condenser extending out through the front or back of the module. By forming the receiver from a metal such as aluminum which is a good heat conductor, heat is efficiently transferred from the solar cells to the heat pipe. The excess heat can then be removed from the condenser section, through the heat conducting cylindrical wall of the receiver body, by cooling tubes having a cooling fluid circulating therethrough, or by cooling fins. Hughes heat pipe Model No. 1370 H100-12, which is commercially available, has been successfully employed for the removal of waste heat from solar cells modules of the type described above.

It is also contemplated that the modules of the present invention may be employed as thermal units wherein the conversion of solar energy to heat energy is desired. In this case, the receiving surface means is in the form of an energy absorbing coating such as a black coating applied directly to the external surface of the receiver body. The concentrated energy is then absorbed and transferred directly to the receiver body to be removed to a point of storage or use by a suitable calculating system which may be of the general type described with reference to FIGS. 4 and 5.

Orientation of the receiver surface parallel to the optical axis, or optical center plane, of the various modules substantially facilitates manufacturing of the modules and enables easy withdrawal of power and/or heat directly through the back of the modules. Further, the heat removal structure may act as a support for the modules to facilitate their mounting in a tracking system. The single reflective systems described, particularly the embodiments employing reflectors having multiple discrete reflective surfaces, enables each module to have a relatively large collection area while at the same time having a relatively shallow reflector depth.

The orientation of the receiver surface also facilitates the collection of the reflected light and makes the light distribution averaging of the single reflected, afocal optical system practical. This light distribution averaging greatly facilitates manufacturing by reducing the accuracy in producing and assembling the optical system required by many of the prior art systems. Further the light distribution averaging feature of the present invention reduces the sensitivity of the system to minor distortions due to thermal expansion or to damage in handling or use.

The transparent window completely covers and provides a hermetically sealed envelope enclosing the optical reflector and receiver. This provides protection for the reflective surface and greatly facilitates maintenance of the devices since the smooth surface of the window can be easily cleaned. This also increases the efficiency of the apparatus by limiting the passage of incoming solar radiation to passing only once through a dirt defect rather than twice as would be necessary in case of dirt accumulating directly on the reflective surface. In this regard, the reflective surface may be on the inner or outer surface of the reflector structure, and various materials may be employed both for the structure of the reflector element and to provide the reflective surface. For example, the reflector may be constructed of glass having a reflective metallic surface deposited thereon. Other materials which may be employed in the reflector structure include synthetic resins such as acrylic material having the desired dimensional stability and resistance to solar radiation and metals such as polished aluminum.

In the circular modules employing a plurality of discrete reflector surface portions which cooperate to distribute reflected energy uniformly over the entire receiver surface, additional economies may be realized by employing one or more reflector segments having reflective surfaces in the shape of classic conic sections, with one or more segments being curved in the planes containing the focal axis, i.e., having its line elements curved, to provide a greater concentration of energy on the lower portion of the receiver surface. This imbalance in energy distribution from the curved segments can thus be made to compensate for the inherent imbalance resulting from the conic section.

While we have disclosed and described preferred embodiments of our invention, we wish it understood that we do not intend to be solely restricted thereto, but rather that we intend to include all embodiments thereof which would be apparent to one skilled in the art and which come within the spirit and scope of our invention.

We claim:

1. Apparatus for collecting and concentrating energy from a remote electromagnetic radiation source, comprising
   first reflector means defining a concave reflective surface having a cross-section including a focal axis, the cross-section being substantially symmetrical about the focal axis,
   support means associated with the first reflector means, and
   receiver means for absorbing energy reflected from the reflective surface of the first reflector means, the receiver means being carried by the support means and including receiver surface means extending in outwardly spaced substantially parallel relation to the focal axis, the receiver surface means having a predetermined finite length along and being substantially symmetrical with respect to the focal axis,
   the reflective surface of the first reflector means being contoured and positioned with respect to the receiver surface means so that radiated electromagnetic energy striking the reflective surface is reflected directly onto and distributed substantially uniformly over the full extent of the receiver surface means when the focal axis is oriented toward the remote electromagnetic radiation source,
   wherein the apparatus has a substantially circular cross-section in the planes perpendicular to the focal axis and a central axis coincident with the focal axis, the reflective surface of the first reflector means is generally conical in configuration,
   the generally conical reflective surface comprising a plurality of generally conical reflective ring segments each having its axis coincident with the focal axis and being contoured and positioned so that the radiated electromagnetic energy striking each such ring segment is reflected directly onto and distributed over the entire receiver surface means, in overlapping relation with radiation reflected from the other ring segments.

2. The apparatus as defined in claim 1 wherein at least selected ones of the generally conical reflective ring segments are slightly curved in the planes containing the focal axis, the slight curvature being such that the reflective ring segments collectively produce the substantially uniform distribution of reflected electromagnetic energy over the receiver surface means.

3. The apparatus as defined in claim 2 further comprising a second reflector means adjacent one end of said receiver surface means, the second reflector means being generally conical and having a reflective surface extending outwardly from the receiver surface means in position to reflect back onto the receiver surface means reflected radiation from the reflective surface of the first reflective means that would otherwise miss said receiver surface means.

4. The apparatus as defined in claim 3 further comprising a third reflector means adjacent the other end of the receiver surface means, the third reflector means being generally conical and having a reflective surface extending outwardly from the receiver surface means in position to reflect back onto the receiver surface means radiation reflected from the reflective surface of the first reflector means that would otherwise miss the receiver surface means.

5. The apparatus as defined in claim 2 wherein at least selected ones of the ring segments are curved in the planes containing the focal axis so that the radiation reflected from each such curved ring segment forms a ring focus between the respective ring segments and the receiver surface means so that the radiation reflected from each such curved ring segment is inverted on the receiver surface means, the reflected radiation from the ring segments collectively being distributed substantially uniformly over the receiver surface means.

6. The apparatus as defined in claim 5 further comprising a second reflector means adjacent one end of the receiver surface means, the second reflector means being generally conical and having a reflective surface extending outwardly from the receiver surface means in position to reflect back onto the receiver surface means reflected radiation from the reflective surface of the first reflector means that would otherwise miss the receiver surface means.

7. The apparatus as defined in claim 6 further comprising a third reflector means adjacent the other end of the receiver surface means, the third reflector means being generally conical and having a reflective surface extending outwardly from the receiver surface means in position to reflect back onto the receiver surface means radiation reflected from the reflective surface of the first reflector means that would otherwise miss the receiver surface means.

8. The apparatus as defined in claim 1 further comprising transparent panel means extending over the first reflector means and cooperating with the first reflector means and the support means to define an enclosure housing the receiver surface means.

9. The apparatus as defined in claim 8 wherein the transparent panel is provided with corrugations, the corrugations being substantially concentric with the axis of the apparatus.

10. The apparatus as defined in claim 8 further comprising heat extractor means for extracting heat from the receiver surface means and removing the extracted heat from within the enclosure.

11. The apparatus as defined in claim 10 wherein the heat extractor means comprises a heat sink, the heat sink including at least a portion of the support means which is in heat exchange relation with the receiver surface means, heat dissipating means outside the enclosure for dissipating heat, and means extending through the enclosure for carrying heat from the receiver surface means to the heat dissipating means.

12. The apparatus as defined in claim 10 wherein the transparent panel is generally dish-shaped and has its center of curvature substantially concentric with the axis of the apparatus.

13. Apparatus for collecting and concentrating energy from a remote electromagnetic radiation source, comprising
first reflector means defining a concave reflective surface having a cross-section including a focal axis, the cross-section being substantially symmetrical about the focal axis,
support means associated with the first reflector means, and
receiver means for absorbing energy reflected from the reflective surface of the first reflector means, the receiver means being carried by the support means and including receiver surface means extending in outwardly spaced substantially parallel relation to the focal axis, the receiver surface means having a predetermined finite length along and being substantially symmetrical with respect to the focal axis,
the reflective surface of the first reflector means being contoured and positioned with respect to the receiver surface means so that radiated electromagnetic energy striking the reflective surface is reflected directly onto and distributed substantially uniformly over the full extent of the receiver surface means when the focal axis is oriented toward the remote electromagnetic radiation source,
the apparatus having a shape generated by translating the cross-section and its focal axis along a line perpendicular to the focal axis and to the plane of the cross-section to develop an elongated module in which the first reflector means is a trough-shaped structure having a focal plane defined by the path through which the focal axis is translated and wherein the receiver surface means is disposed in laterally spaced parallel relation to the focal plane on each side thereof.

14. The apparatus as defined in claim 13 wherein the reflective surface comprises a plurality of elongated reflective surface segments disposed in edge-to-edge relation on each side of the focal plane, said reflective surface segments being positioned and contoured so that radiated electromagnetic energy striking each elongated reflective surface segment is reflected directly onto and distributed substantially uniformly over the portion of the receiver surface means disposed on the corresponding side of the focal plane.

15. The apparatus as defined in claim 14 wherein at least selected ones of the elongated reflective surface segments are slightly curved in a plane perpendicular to the focal plane whereby radiation reflected from each such segment is focussed along a line between the respective segments and the receiver surface means such that the radiation reflected from each such segment is inverted before reaching the receiver surface means.

16. Solar cell apparatus for collecting, concentrating and converting solar energy to electric energy comprising,
first reflector means defining a concave reflective surface has a cross-section including a focal axis and being substantially symmetrical about the focal axis,
support means associated with the first reflector means, and
receiver means for absorbing energy reflected from the first reflective surface of the first reflector means, the receiver means being carried by the support means and including a plurality of photovoltaic solar cells defining a receiver surface extending in outwardly spaced substantially parallel relation to the focal axis, the receiver surface having a predetermined finite length along and being substantially symmetrical with respect to the focal axis,
the reflective surface of the first reflector means being contoured and positioned with respect to the receiver surface so that reflected solar energy striking the reflector surface is reflected directly onto and distributed substantially uniformly over the full extent of the receiver surface when the focal axis is oriented toward the sun,
wherein the apparatus is substantially circular in cross-section in the planes perpendicular to the focal axis and having a central axis coincident with the focal axis, the reflective surface of the first reflector means being generally conical in configuration,
wherein the generally conical reflective surface comprises a plurality of generally conical reflective ring segments each having its axis coincident with the focal axis and being contoured and positioned so that the radiated solar energy striking each such ring segment s reflected directly onto and distributed over the entire receiver surface in overlapping relation with radiation reflected from the other ring segments.

17. The apparatus as defined in claim 16 wherein at least selected ones of the generally conical reflective ring segments are slightly curved in the planes containing the focal axis, the slight curvature being such that the reflective ring segments collectively produce the substantially uniform distribution of reflected solar energy over the receiver surface.

18. The apparatus as defined in claim 17 further comprising a second reflector means adjacent one end of the receiving surface, the second reflector means being generally conical and having a reflective surface extending outwardly from the receiver surface in position to reflect back onto the receiver surface reflected radiation from the reflective surface of the first reflector means that would otherwise miss the receiver surface.

19. The apparatus as defined in claim 18 further comprising a third reflector means adjacent the other end of the receiver surface, the third reflector means being generally conical and having a reflective surface extending outwardly from the receiver surface radiation reflected from said reflector surface that would otherwise miss the receiver surface.

20. The apparatus as defined in claim 16 wherein at least selected ones of the ring segments are curved in the planes containing the focal axis so that the radiation reflected from each such curved ring segment forms a ring focus between the respective ring segments and the receiver surface so that the radiation reflected from each such curved ring segment is inverted on the receiver surface, the reflected radiation from the ring segments collectively being distributed substantially uniformly over the receiver surface.

21. The apparatus as defined in claim 20 further comprising a second reflector means adjacent one end of the receiver surface, the second reflector means being generally conical and having a reflective surface extending outwardly from the receiver surface in position to reflect back onto the receiver surface reflected radiation from the reflective surface of the first reflector that would otherwise miss the receiver surface.

22. The apparatus as defined in claim 21 further comprising a third reflector means adjacent the other end of the receiver surface, the third reflector means being generally conical and having a reflective surface extending outwardly from the receiver surface in position to reflect back onto the receiver surface radiation reflected from the reflective surface of the first reflective means that would otherwise miss the receiver surface.

23. The apparatus as defined in claim 16 wherein the support means comprises a prismatic section having a plurality of flat faces extending in outwardly spaced parallel relation to the focal axis and with the prismatic section having its axis substantially coincident with the focal axis, the photovoltaic solar cells being mounted directly on the faces.

24. The apparatus as defined in claim 23 further comprising transparent panel means extending over the reflector means and cooperating with the reflector means and the support means to define an enclosure housing the receiver surface.

25. The apparatus as defined in claim 24 further comprising heat extractor means for extracting heat from the receiver surface means and removing the extracted heat from within the enclosure.

26. The apparatus as defined in claim 16 wherein the heat extractor means comprises a heat sink, the heat sink including at least a portion of the support means which is in heat exchange relation with the receiver surface means, heat dissipating means outside the enclosure for dissipating heat, and means extending through the enclosure for carrying heat from the receiver surface means to the heat dissipating means.

27. The apparatus as defined in claim 24 wherein the support means has a hollow interior extending throughout at least a substantial portion of the prismatic section, and wherein the heat extractor means comprises means for circulating a cooling fluid through said hollow interior.

28. The apparatus as defined in claim 24 wherein the transparent panel is provided with corrugations, the corrugations being substantially concentric with the axis of the apparatus.

* * * * *

UNITED STATES PATENT AND TRADEMARK OFFICE
CERTIFICATE OF CORRECTION

PATENT NO. : 4,337,758

DATED : July 6, 1982

INVENTOR(S) : Aden B. Meinel et al

It is certified that error appears in the above-identified patent and that said Letters Patent is hereby corrected as shown below:

Column 10, line 40, "calculating" should read -- circulating --.

Column 14, line 46, "s" should read -- is --

Column 15, line 28, "reflective" should read -- reflector --.

Signed and Sealed this

Fifteenth Day of February 1983

[SEAL]

Attest:

GERALD J. MOSSINGHOFF

Attesting Officer

Commissioner of Patents and Trademarks